United States Patent [19]
Schmidt et al.

[11] Patent Number: 5,712,517
[45] Date of Patent: Jan. 27, 1998

[54] EPOXY INSULATOR COATING ON AN ALTERNATOR HEAT SINK

[75] Inventors: Eric Alexander Schmidt, Redford; Jeffrey Wayne Riedel, Tecumseh, both of Mich.

[73] Assignee: Ford Motor Company, Dearborn, Mich.

[21] Appl. No.: 945,036

[22] Filed: Sep. 15, 1992

[51] Int. Cl.[6] ............................................. H02K 9/00
[52] U.S. Cl. ................................. 310/45; 310/58; 310/64; 310/68 D
[58] Field of Search ........................ 310/45, 58, 64, 310/65, 68 D; 361/413

[56] References Cited

U.S. PATENT DOCUMENTS

| | | | |
|---|---|---|---|
| 3,295,046 | 12/1966 | Margaira | 321/8 |
| 3,538,362 | 11/1970 | Cheetham et al. | 310/68 |
| 3,895,247 | 7/1975 | Iwata et al. | 310/68 D |
| 4,161,775 | 7/1979 | Franz et al. | 363/145 |
| 4,546,408 | 10/1985 | Rodseth et al. | 361/386 |
| 4,588,915 | 5/1986 | Gold | 310/194 |
| 4,602,678 | 7/1986 | Fick | 165/79 |
| 4,799,309 | 1/1989 | Cinzori et al. | 29/596 |
| 4,835,427 | 5/1989 | Böhm et al. | 310/68 D |
| 4,915,068 | 4/1990 | Tharman | 123/149 R |
| 4,952,829 | 8/1990 | Armbruster et al. | 310/68 D |
| 5,043,612 | 8/1991 | Lakin | 310/45 |

OTHER PUBLICATIONS

Hysol Technical Information, Bulletin E8-233, Oct. 1985.
"User Guide to Power Coating", The Association for Finished Processes of the Society of Manufacturing Engineers, pp. 72-82.

Primary Examiner—Thomas M. Dougherty
Attorney, Agent, or Firm—Paul K. Godwin

[57] ABSTRACT

A resinous coating applied to the heat sink portion of an alternator housing provides a low cost method for insulating a portion of the rectifier assembly from the housing and for insulating the stator winding lead wires that are routed through coated heat sink ventilation windows.

6 Claims, 3 Drawing Sheets

EPOXY INSULATOR COATING ON AN ALTERNATOR HEAT SINK

BACKGROUND OF THE INVENTION

1. Field of the Invention

The present invention is directed to the field of mechanically driven electrical alternators and more specifically to the area of providing adequate electrical insulation and heat conduction between electrical components and an alternator heat sink.

2. Description of the Prior Art

Alternators, as used in automotive applications, are assembled within a heat conducting housing, such as, cast aluminum. More recently, alternators have been available in which the housing was formed of several cast aluminum elements stacked together to facilitate automated assembly processes. For instance, commonly assigned application Ser. No. 07/645,924 (co-pending herewith) illustrates the use of a three-element housing in which a first element defines one end of the housing, provides support for a rotor bearing and surrounds a cooling fan and stator laminations. A second element defines an intermediate portion of the housing and serves as a heat sink that supports a rectifier assembly. The second element mates with circular edges on the first element, abuts against the stator laminations, and contains a plurality of ventilation windows surrounding a second fan. A third element defines the other end of the housing, provides support for a second rotor bearing and is formed to protect the rectifier assembly mounted on the second element.

In prior art alternators, it is necessary to route the leads from stator windings to rectifier elements mounted within the alternator housing. Although the stator windings themselves are covered with an insulating varnish, the wire leads, which extend therefrom, are partially stripped and cleaned preparatory to being soldered to the rectifier assembly. In addition, the wire leads are subjected to vibration, bending and possible contact with metal surfaces in the alternator. Accordingly, in prior art alternators, a woven insulator sleeve is normally placed on each pair of closely adjacent and commonly connected stator winding leads in order to provide an insulator barrier between the leads and the housing. Of course, such insulating sleeves occupy volume that partially obstructs the flow of cooling air.

In commonly assigned U.S. Pat. No. 4,799,309, a method of forming a rectifier circuit is described, whereby interconnection leads of the circuit are formed on an aluminum heat sink plate. An electrically insulating layer of aluminum oxide is deposited on the plate and an inert mask is placed over a portion of the aluminum oxide layer to expose areas onto which a subsequent conducting layer is deposited. The conducting layer is formed by use of a flame or plasma spraying technique which deposits copper over a predetermined pattern on the mask exposed portions of the aluminum oxide insulating layer. Although efficient in operation, it would be desirable to reduce the number and complexity of steps used in that process of manufacture.

SUMMARY OF THE INVENTION

The present invention is intended to improve the efficiency in both the assembly and the operation of alternators. These improvements are achieved by coating the heat sink housing element with a resinous material that has favorable electrical insulating and heat conducting properties. In the assembly improvement, the labor intensive task of manually placing insulator sleeves on stator winding leads is eliminated. Also, the use of costly plasma spraying equipment and masks to deposit several precisely registered coatings to form the rectifier circuit is eliminated. Operation improvements include cooler operation due to increased air flow where woven sleeves are no longer used and reduced noise levels due to the coating having the effect of rounding sharp corners where cooling air flows through the heat sink. Also, the present invention prevents the oxidation of the surface of the heat sink component. This is especially advantageous in northern climates where corrosive salts are used on roadways.

The present invention provides for the application of a coating of resinous material on the exposed surfaces of a heat sink housing element including the ventilation windows thereof through which stator winding lead wires extend from their respective stator windings to the rectifier assembly. The resinous material is a thermo-setting epoxy resin based powder that is heat treated to form a continuous insulative coating on the housing element. The coating provides reliable electrical insulation in a medium that also has highly efficient thermal transfer properties for conducting heat from the heat sink housing element to the adjacent air surface surrounding the housing.

DETAILED DESCRIPTION OF THE PREFERRED EMBODIMENT

Figure 1:
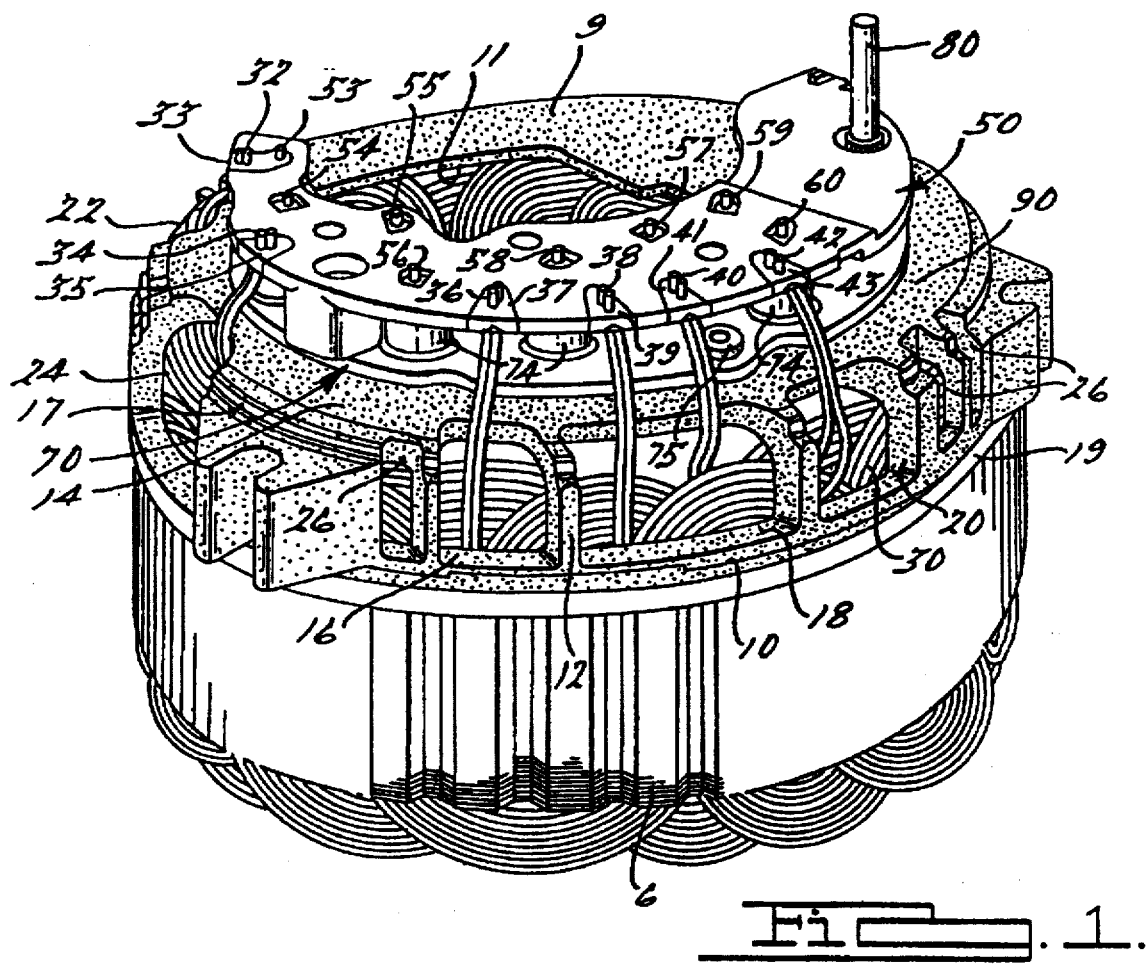
FIG. 1 is a perspective view of a portion of an alternators including a housing element containing the present invention.

FIGS. 1, 3, 4 and 5 show a partial alternator assembly in which a cast aluminum control plate/heat sink 10 serves as a housing element to which the resinous coating 90 of the present invention is applied. The control plate/heat sink 10 includes a central opening 11 through which a rotor shaft with a bearing and a set of slip rings (not shown) extend when the entire alternator is assembled. The control plate/heat sink 10 also includes a generally planar surface 9 which defines the central opening 11 and provides grounding for several rectifier diodes mounted in apertures therethrough and discussed below. The control plate/heat sink 10 has a cup shape due to the inclusion of an integral cylindrical wall 12 extending from the planar surface 9. The entire casting is coated with an epoxy resin material 90 which has both electrical insulating and heat conduction properties. The details of application are described below.

A plurality of stator coil lead wire pairs 36, 38/40, 42, 32 and 34, correspondingly pass through ventilation windows 16, 18, 20, 22, and 24 formed in the cylindrical wall 12 of the control plate/heat sink 10. Other ventilation windows 26 are included to provide additional venting and air circulation from a fan mounted on the rotor (not shown) and beneath the opening 11. The control plate/heat sink 10 is mounted onto a lamination stack 6 that surrounds a plurality of stator windings 30.

A commercially available thermal transfer grease is deposited over an area 9 of the surface of the epoxy resin coating 90. An, interconnection plate 70 is mounted on the area 72 of the epoxy coating on the surface of the control plate/heat sink 10. The thermal transfer grease acts to fill any voids that may occur between the opposing surfaces and to facilitate the heat transfer from the interconnection plate 70 to the control plate/heat sink 10. The interconnection plate 70 is an electrically conductive member, Such as aluminum, that provides electrical interconnection for the cathodes of the positive diodes 74 of the rectifier assembly that are press fit into apertures formed therein. A B+ output terminal post 80 is staked into an aperture formed in the interconnection plate 70 and is therefore electrically connected to the plate 70. Rivets 75 with rivet insulators 76 are used to secure the interconnection plate 70 to the upper surface 9 of the control plate/heat sink 10. The epoxy resin coating 90 and the insulated rivets 75 ensure that the interconnection plate 70 is electrically isolated from the control plate/heat sink 10.

A terminal plate 50 is mounted above the interconnection plate 70 and internally provides an conduction circuit laminated between upper and lower layers of an electrically insulating plastic or ceramic material. Lead wires 53, 55, 57 and 59, extending from the cathodes of negative diodes, are connected to corresponding terminals on the terminal plate 50. The negative diodes have their anodes press fit mounted into uncoated apertures (not shown) formed in the control plate/heat sink 10 and are thereby grounded to the housing of the alternator when fully assembled. Lead wires 54, 56, 58 and 60, extending from the anodes of positive diodes 74 press fit mounted in the interconnection plate 70, are connected to corresponding terminals on the terminal plate 50. In addition, stator lead wire pairs 32, 34, 36, 38, 40 and 42 are respectively connected (soldered) to terminals 33, 35, 37, 39, 41 and 43. The B+ output terminal post 80, connected to the positive interconnection plate 70, is shown extending through terminal plate 50.

Figure 2:
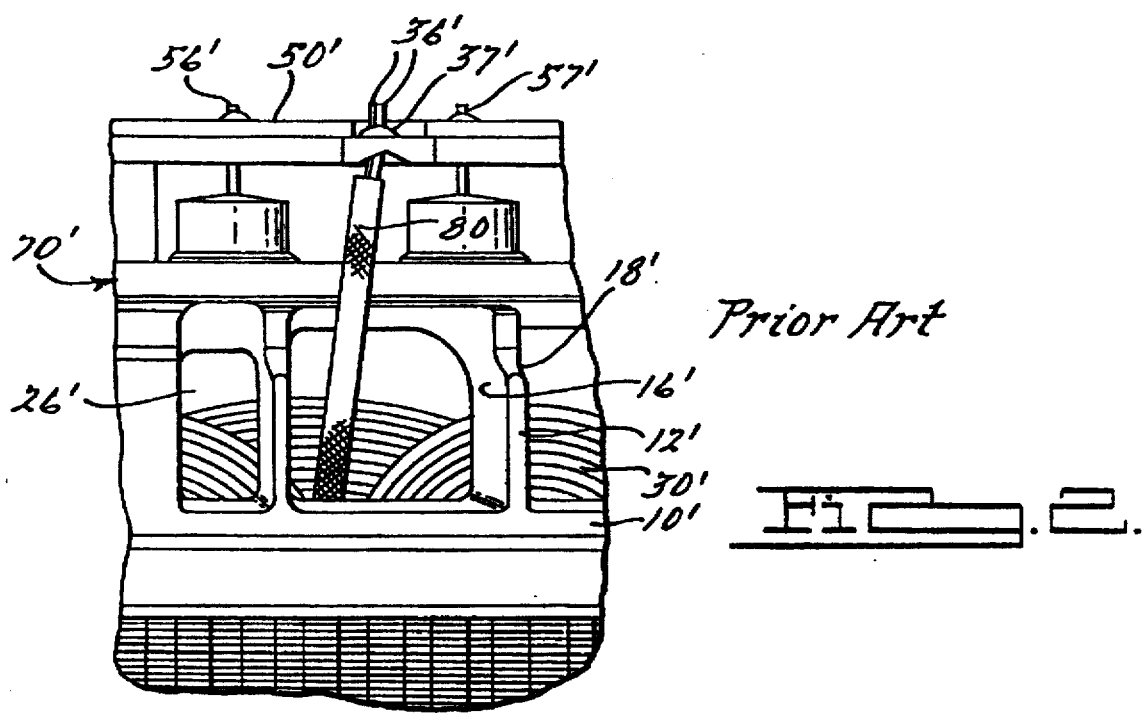
FIG. 2 illustrates prior art woven insulators installed on stator winding lead wires.
Figure 3:
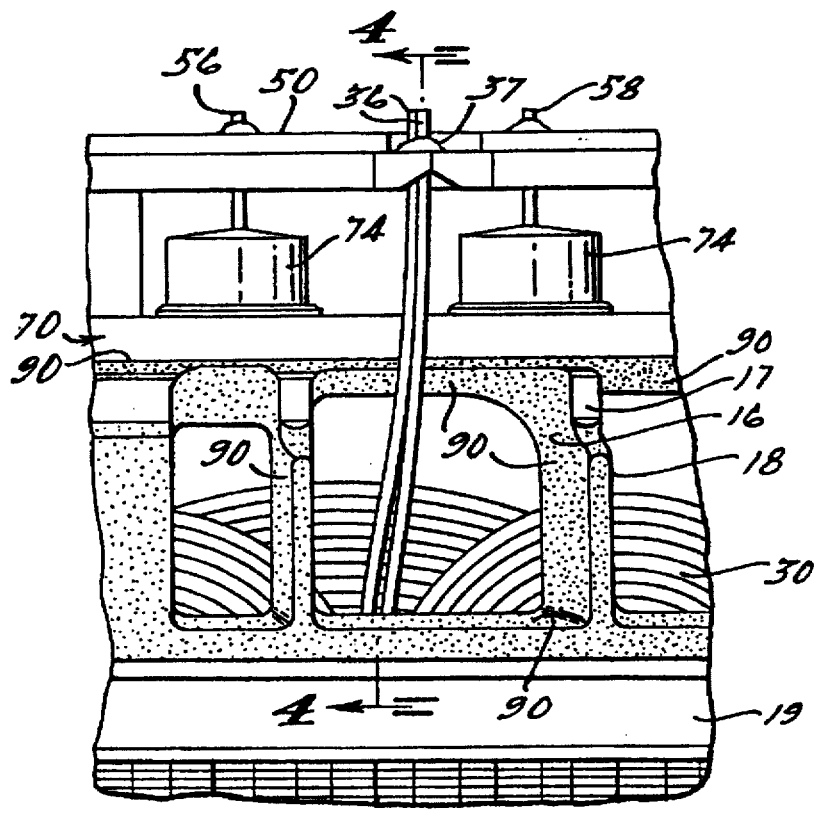
FIG. 3 shows absence of woven insulators on stator winding lead wires made possible by the present invention.
Figure 4:
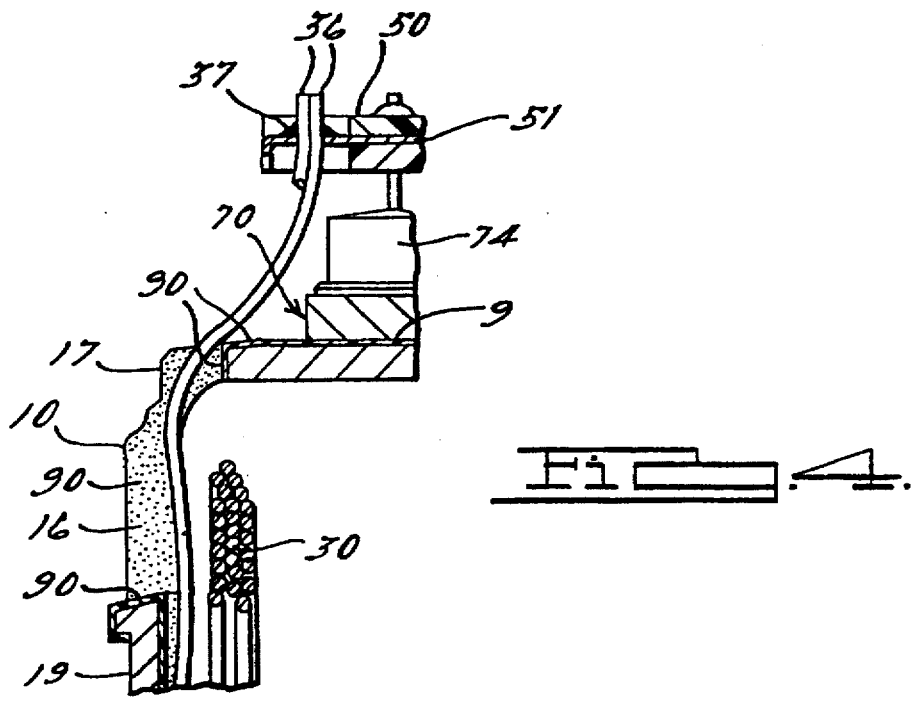
FIG. 4 is a cross-sectional view taken along lines 4—4 in FIG. 3.
Figure 5:
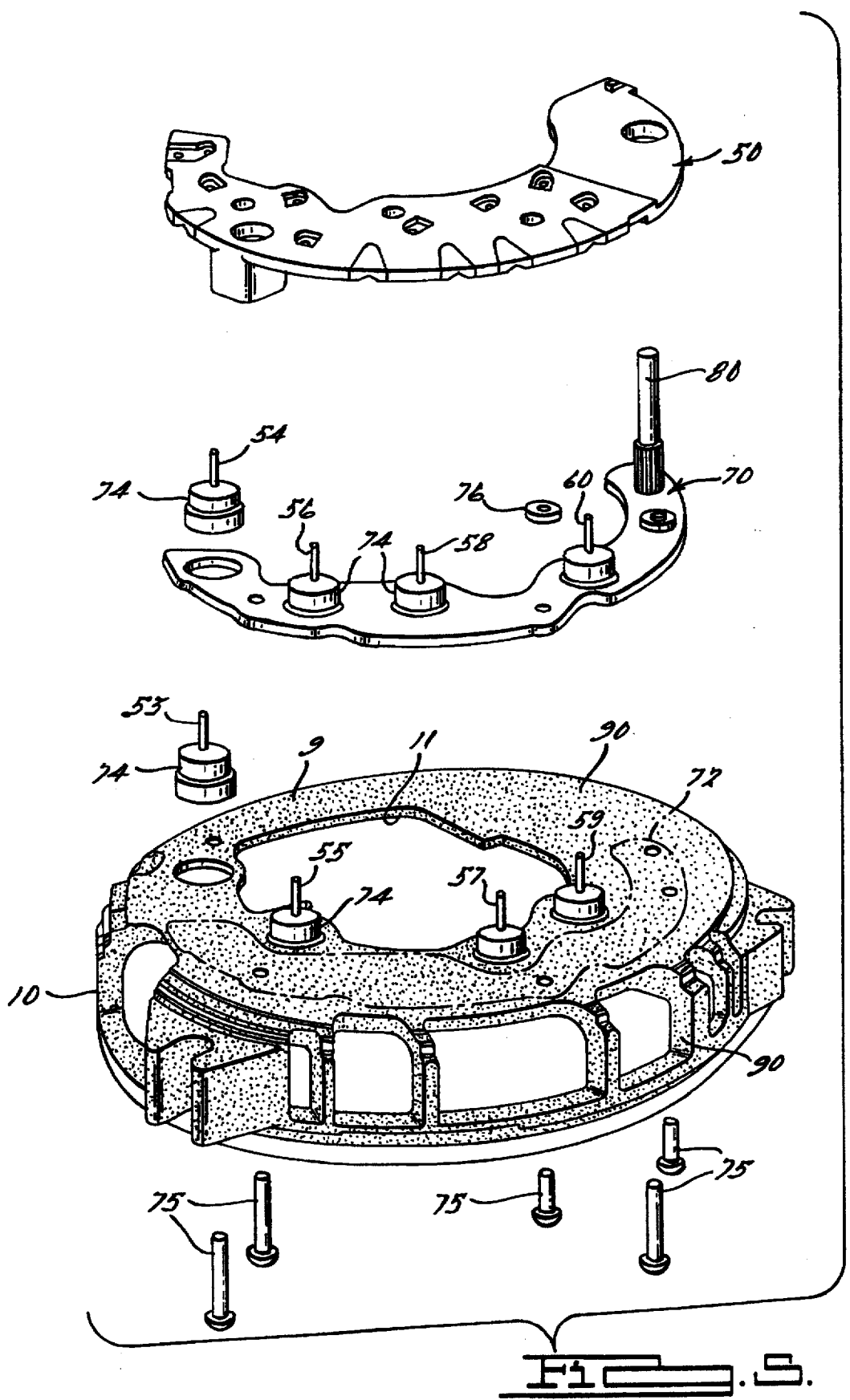
FIG. 5 is an exploded view of a heat sink rectifier assembly of an alternator employing the present invention.

As mentioned above in the Background of the Invention and as shown in FIG. 2, prior art alternators of this kind utilize woven acrylic insulator sleeves 80 on stator lead wires depicted here as 36'. The stator lead wires 36', extend from the varnish coated stator windings 30 and are also partially coated with varnish. The lead wires 36' are routed through ventilation window 16' found in the cylindrical wall 12' of the heat sink 10'. The end portions of the lead wires are cleaned of all insulating material and other contaminants prior to being soldered at terminal 37' on the control interconnection plate 50'. The bending and handling of the lead wires during this and the assembly process can cause the varnish to crack, sometimes exposing the copper of the lead wires, which are then susceptible to being contacted with other electrically conducting elements of the alternator including the grounded control plate housing 10'. Accordingly, it was necessary to place the acrylic woven insulators 80 over each of the stator wire pairs prior to making the solder connections at the interconnection plate 50'.

The present invention eliminates the need for providing the insulator sleeves 80 on stator lead wires by coating the stator windows 16, 18, 20, 22 and 24 with an epoxy resin insulating coating 90. The stippled portion of FIGS. 1, 3, 4 and 5 illustrate the application area of the invention on the alternator.

Prior to applying the coating and mounting components, the casting is cleaned with an alkaline based cleaner and its surface portion is conditioned for phosphate conversion using an alkaline based conditioner designed for aluminum products. Subsequently, a fine grained zinc phosphate conversion coating is deposited on the casting and rinsed with water. The phosphate is sealed by the application of an acidic based solution containing hexavalent chromium. Following the sealing step, the casting is rinsed in de-ionized water.

A thermal setting epoxy resin based powder such as that available from Hysol Division of the Dexter Corporation under the tradename HYSOL®DK15-02 or DK-0964 is used to coat the heat sink 10. Prior to coating, the aluminum control plate/heat sink 10 is heated to the recommended temperature, and the fine grained powder epoxy material is blown by forced air over the the surface of the heated aluminum control plate/heat sink 10. Upon contact with the heated part, the powder melts and bonds to the aluminum. The coated casting is then further heated to the temperature prescribed by the epoxy resin manufacturer until cross linking occurs and the resin is set. Subsequent cooling produces an epoxy coating which is both electrically insulative and thermally conductive. In that manner, the heat sink properties of the aluminum casting forming the control plate/heat sink 10 are not diminished, but rather are enhanced and preserved as the alternator ages and oxidation is prevented from occuring where the epoxy coating resides.

Following the application of the coating, the casting is machined to expose the aluminum surface at circular bands 17 and 19 and for mounting negative diodes and bearings where metal to metal contact is required. Bands 17 and 19 are used to complete the common electrical ground connection when mated with other housing elements (not shown).

The invention results in alternators being built with less assembly steps and with increased reliability when in use. The use of the epoxy resin coating provides the necessary electrical insulation barrier between the lead wires and the housing and prevents heat sink oxidation in the coated areas. By eliminating the woven sleeves on the stator lead wires, the ventilation windows of the heat sink are less obstructed and therefore allow more air to flow and cooling to be enhanced. Further cooling is achieved due to the invention, because the stator lead wires are also exposed to the flowing air. The coating alters the air flow characteristics by smoothing and rounding the heat sink window surfaces and edges, thereby providing a more laminar and less turbulent flow of cooling air through the alternator. It is believed that this is also responsible for the overall reduction in alternator noise level.

It will be apparent that many modifications and variations may be implemented without departing from the scope of the novel concept of this invention. Therefore, it is intended by the appended claims to cover all such modifications and variations which fall within the true spirit and scope of the invention.

We claim:

1. An improved electrical alternator including a plurality of stator windings and a rectifier assembly, the respective stator lead wires of the stator windings are connected to said rectifier assembly and are disposed within a housing, said housing is formed from an electrically and heat conducting material with a centrally apertured plate integrally formed with a cup portion having a cylindrical wall that extends parallel to a center axis and surrounds a portion of said stator windings;

said rectifier assembly includes an interconnection plate mounted on said apertured plate of said housing and said interconnection plate provides solder terminals for the connection of said stator lead wires extending from said stator windings;

said cylindrical wall portion of said housing contains a plurality of ventilation windows with some windows being sufficiently large to allow stator lead wires to extend from their respective stator windings to the interconnection plate mounted on said deck plate;

the improvement comprising a coating of a resinous material on the exposed housing surfaces of said windows through which said stator lead wires extend from their respective stator windings to said interconnection plate and thereby providing electrical insulation between said lead wires and said housing.

2. An improved alternator as in claim 1, wherein said housing of said alternator is formed of aluminum and said resinous coating is applied as a thermosetting epoxy resin based powder that is heat treated to form a continuous insulative coating.

3. An improved alternator as in claim 1, wherein said stator windings are coated with varnish to prevent shorting between adjacent windings and a portion of the stator wires extending through said windows have varnish removed for connection to the solder terminals on said interconnection plate.

4. An improved alternator as in claim 1, wherein said coating is applied to said housing during a manufacturing process that includes a step of machining the nonwindow portions of said housing and said coating is applied prior to said step of machining.

5. An alternator heat sink element for an automotive alternator comprising a planar portion for retaining an electrical rectifier assembly and a cylindrical portion with a plurality of apertures for allowing ventillation air to circulate into and out of the alternator, wherein said heat sink element is coated with a epoxy resin material having the properties of electrical insulation and heat conductivity.

6. An alternator including a rectifier assembly, a heat sink housing element and a set of stator windings, wherein said rectifier assembly is mounted on said heat sink housing element, said heat sink housing element surrounds a portion of said stator windings and contains apertures through which lead wires from said stator windings pass for connection to said rectifier assembly, and at least said apertures of said heat sink are coated with an epoxy resin material to provide electrical insulation between said lead wires and said heat sink.

* * * * *